US008679868B2

(12) United States Patent
Gupta et al.

(10) Patent No.: US 8,679,868 B2
(45) Date of Patent: Mar. 25, 2014

(54) BIFACIAL SOLAR CELL USING ION IMPLANTATION

(71) Applicants: Atul Gupta, Beverly, MA (US); Nicholas P. T. Bateman, Reading, MA (US)

(72) Inventors: Atul Gupta, Beverly, MA (US); Nicholas P. T. Bateman, Reading, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/043,115

(22) Filed: Oct. 1, 2013

(65) Prior Publication Data

US 2014/0030844 A1    Jan. 30, 2014

Related U.S. Application Data

(63) Continuation of application No. 13/413,965, filed on Mar. 7, 2012, now Pat. No. 8,546,157, which is a continuation of application No. 13/010,303, filed on Jan. 20, 2011, now Pat. No. 8,153,456.

(60) Provisional application No. 61/296,609, filed on Jan. 20, 2010.

(51) Int. Cl.
*H01L 21/00*    (2006.01)

(52) U.S. Cl.
USPC ............... 438/22; 438/23; 438/45; 438/47; 438/57; 438/98; 257/53; 257/80; 257/81

(58) Field of Classification Search
USPC ............. 438/22, 24, 45, 47, 48, 57, 94, 98; 257/53, 59, 80, 81, 84, 85, E31.001, 257/E31.002, E31.102
See application file for complete search history.

(56) References Cited

U.S. PATENT DOCUMENTS

2006/0255340 A1 *  11/2006  Manivannan et al. .......... 257/79

* cited by examiner

*Primary Examiner* — Hsien Ming Lee

(57) ABSTRACT

An improved bifacial solar cell is disclosed. In some embodiments, the front side includes an n-type field surface field, while the back side includes a p-type emitter. In other embodiments, the p-type emitter is on the front side. To maximize the diffusion of majority carriers and lower the series resistance between the contact and the substrate, the regions beneath the metal contacts are more heavily doped. Thus, regions of higher dopant concentration are created in at least one of the FSF or the emitter. These regions are created through the use of selective implants, which can be performed on one or two sides of the bifacial solar cell to improve efficiency.

12 Claims, 5 Drawing Sheets

BIFACIAL SOLAR CELL USING ION IMPLANTATION

This application is a continuation of U.S. patent application Ser. No. 13/413,965, filed on Mar. 7, 2012, which is a continuation of and claims priority to U.S. patent application Ser. No. 13/010,303, filed Jan. 20, 2011, which claims priority to U.S. Provisional Patent Application No. 61/296,609, filed Jan. 20, 2010, the disclosures of which are hereby incorporated by reference.

FIELD

This invention relates to solar cells and, more particularly, to solar cells formed using ion implantation.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Solar cells are one example of a device that uses silicon workpieces. Any reduced cost to the manufacture or production of high-performance solar cells or any efficiency improvement to high-performance solar cells would have a positive impact on the implementation of solar cells worldwide. This will enable the wider availability of this clean energy technology.

Solar cells are typically manufactured using the same processes used for other semiconductor devices, often using silicon as the substrate material. A semiconductor solar cell is a simple device having an in-built electric field that separates the charge carriers generated through the absorption of photons in the semiconductor material. This electric field is typically created through the formation of a p-n junction (diode) which is created by differential doping of the semiconductor material. Doping a part of the semiconductor substrate (e.g. surface region) with impurities of opposite polarity forms a p-n junction that may be used as a photovoltaic device converting light into electricity.

FIG. 1 shows a cross section of a representative solar cell 100, where the p-n junction 120 is located away from the illuminated surface. Photons 10 enter the solar cell 100 through the top (or illuminated) surface, as signified by the arrows. These photons pass through an anti-reflective coating 104, designed to maximize the number of photons that penetrate the substrate 100 and minimize those that are reflected away from the substrate. The ARC 104 may be comprised of an $SiN_x$ layer. Beneath the ARC 104 may be a passivation layer 103, which may be composed of silicon dioxide. Of course, other dielectrics may be used. On the back side of the solar cell 100 are an aluminum emitter region 106 and an aluminum layer 107. Such a design may be referred to as an Al back emitter cell in one instance.

Internally, the solar cell 100 is formed so as to have a p-n junction 120. This junction is shown as being substantially parallel to the bottom surface of the solar cell 100, although there are other implementations where the junction may not be parallel to the surface. In some embodiments, the solar cell 100 is fabricated using an n-type substrate 101. The photons 10 enter the solar cell 100 through the n+ doped region, also known as the front surface field (FSF) 102. The photons with sufficient energy (above the bandgap of the semiconductor) are able to promote an electron within the semiconductor material's valence band to the conduction band. Associated with this free electron is a corresponding positively charged hole in the valence band. In order to generate a photocurrent that can drive an external load, these electron-hole (e-h) pairs need to be separated. This is done through the built-in electric field at the p-n junction 120. Thus, any e-h pairs that are generated in the depletion region of the p-n junction 120 get separated, as are any other minority carriers that diffuse to the depletion region of the device. Since a majority of the incident photons 10 are absorbed in near surface regions of the solar cell 100, the minority carriers generated in the emitter need to diffuse to the depletion region and get swept across to the other side.

Some photons 10 pass through the front surface field 102 and enter the p-type emitter 106. These photons 10 can then excite electrons within the p-type emitter 106, which are free to move into the front surface field 102. The associated holes remain in the emitter 106. As a result of the charge separation caused by the presence of this p-n junction 120, the extra carriers (electrons and holes) generated by the photons 10 can then be used to drive an external load to complete the circuit.

By externally connecting the base through the front surface field 102 to the emitter 106 through an external load, it is possible to conduct current and therefore provide power. To achieve this, contacts 105, typically metallic and in some embodiments silver, are placed on the outer surface of the front surface field 102.

It may be advantageous to more heavily dope the regions on which the contacts 105 interface. These regions may be made by using implantation in conjunction with a traditional lithographic mask, which can then be removed easily before dopant activation. Another alternative is to use a shadow mask in the implanter to define the highly doped areas for the contacts. All of these techniques utilize a fixed masking layer (either directly on the substrate or in the beamline). In addition to traditional beamline or plasma deposition systems, other implant systems may be used. For example, a flood ion implanter without mass analysis or a plasma tool that focuses ions by modifying the plasma sheath may also be used.

While blanket doping steps may use an ion implanter or other processing steps, selective implantation may use a mask or an ion beam modified by the plasma sheath. Turning to FIG. 2, a cross-sectional diagram of selective implantation is illustrated. When a specific pattern of ion implantation or doping in a workpiece 200, such as a solar cell, is desired, then a mask 201 may be used. This mask 201 may be a shadow or proximity mask. The mask 201 is placed in front of a substrate 200 in the path of a species 204 during implantation. This species 204 may be a dopant. The substrate 200 may be placed on a platen 203, which may use electrostatic or physical force to retain the substrate 200. The mask 201 has apertures 202 that correspond to the desired pattern of ion implantation in the substrate 200. The apertures 202 may be stripes, dots, or other shapes. While the mask 201 is illustrated, photoresist, other hard masks, or other methods including but not limited to using ion beams modified by the plasma sheath known to those skilled in the art likewise may be used in an alternate embodiment.

An enhancement to solar cells is the addition of heavily doped substrate contact regions. Turning back to FIG. 1, these heavily doped contact regions correspond to the areas where the metallic fingers 105 will be affixed to the solar cell 100. The introduction of these heavily doped contact regions allows much better electrical contact between the solar cell 100 and the metallic contacts 105 and significantly lowers the series resistance of the solar cell 100. The use of heavily doped regions on the surface of the emitter are referred to as a selective emitter design. Similarly, the use of heavily doped contact regions on a surface field is referred to as selective front surface field (FSF) or back surface field (BSF) design.

A selective emitter, FSF, or BSF design for a solar cell also has the advantage of higher efficiency cells due to reduced minority carrier losses through recombination due to lower dopant/impurity dose in the exposed regions of the emitter layer. The higher doping under the contact regions provides a field that repels the minority carriers generated in the emitter or base and pushes them towards the p-n junction thus reducing the recombination losses of minority carriers to the metal contacts.

A second enhancement to solar cells is the creation of bifacial solar cells. Bifacial solar cells are configured to produce power by absorbing light from two sides of the solar cell. Thus, instead on having a solid layer of aluminum (or other material) on the back surface, as shown in FIG. 1, a grid or pattern of contacts may be used.

Previously, mirrors or reflectors were required to collect sunlight on more than one side of a solar cell because the solar cells were only able to accept photons introduced on one side. Use of more than one side of a solar cell increases solar cell efficiency. Another advantage of a bifacial solar cell is the fact that the power output is less sensitive to the time of the day since the light scattered at non-normal incidences gets back reflected toward the solar cell, thus improving the levelized cost of electricity (LCOE) equation of such solar cells. One example of a place where such modules would be preferred would be near sandy beaches or other sandy locations where the light reflected from the sands would be absorbed on the underside of a bifacial solar cell integrated into the ceiling of an overhead structure.

Therefore, there is a need in the art for an improved bifacial solar cell to maximize the energy that can be produced from incident photons.

SUMMARY

An improved bifacial solar cell is disclosed. In some embodiments, the front side includes an n-type surface field, while the back side includes a p-type emitter. In other embodiments, the p-type emitter is on the front side. To maximize the diffusion of majority carriers and lower the series resistance between the contact and the substrate, the regions beneath the metal contacts are more heavily doped. Thus, regions of higher dopant concentration are created in at least one of the FSF or the emitter. These regions are created through the use of selective implants, which can be performed on one or two sides of the bifacial solar cell to improve efficiency.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the solar cell are described herein in connection with an ion implanter. Beamline ion implanters, plasma doping ion implanters, or flood ion implanters may be used. In addition, other implant systems may be used. For example, an ion implanter without mass analysis or a plasma tool that focuses ions by modifying the plasma sheath may also be used. An ion beam that is focused to only implant specific portions of the solar cell, or grid-focused plasma systems can also be used for the embodiments disclosed herein. However, the gaseous diffusion, furnace diffusion, laser doping, other plasma processing tools, or other methods known to those skilled in the art may be used. In addition, while implant is described, deposition of the doped layers also can be performed. Also, while specific n-type and p-type dopants are listed, other n-type or p-type dopants may be used instead and the embodiments herein are not limited solely to the dopant listed. Thus, the invention is not limited to the specific embodiments described below.

Figure 1:
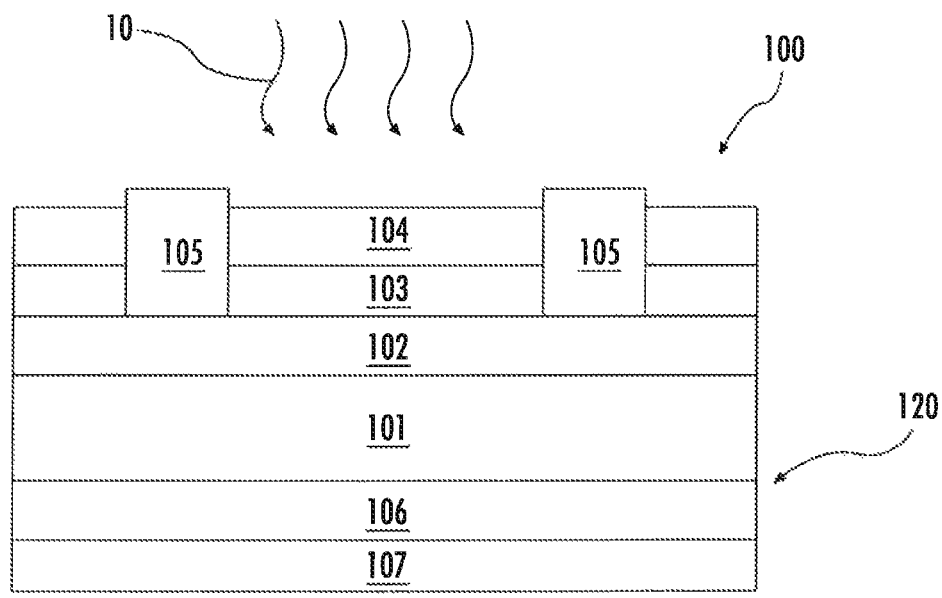
FIG. 1 is a cross-sectional side view of a solar cell of the prior art.
Figure 2:
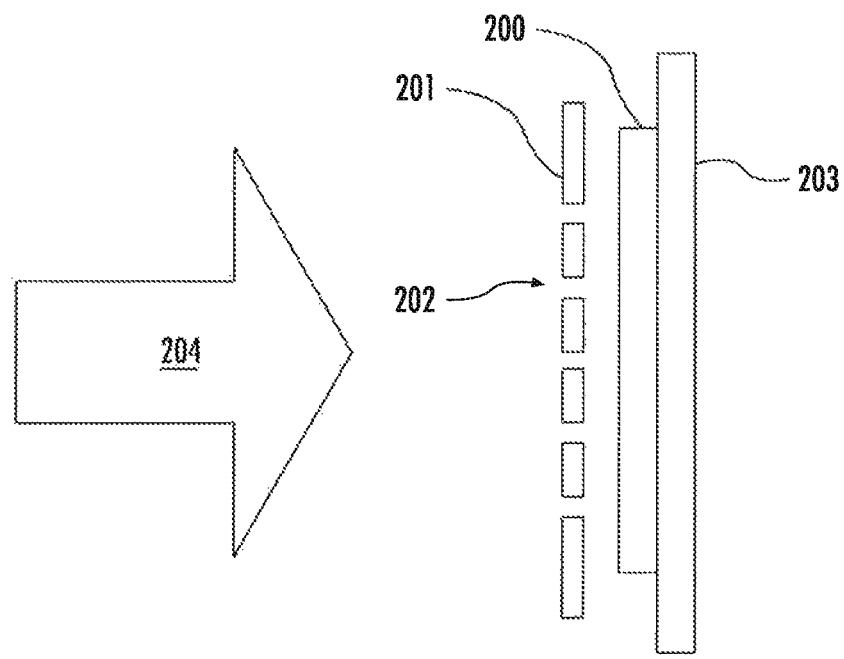
FIG. 2, a cross-sectional diagram of selective implantation.
Figure 3:
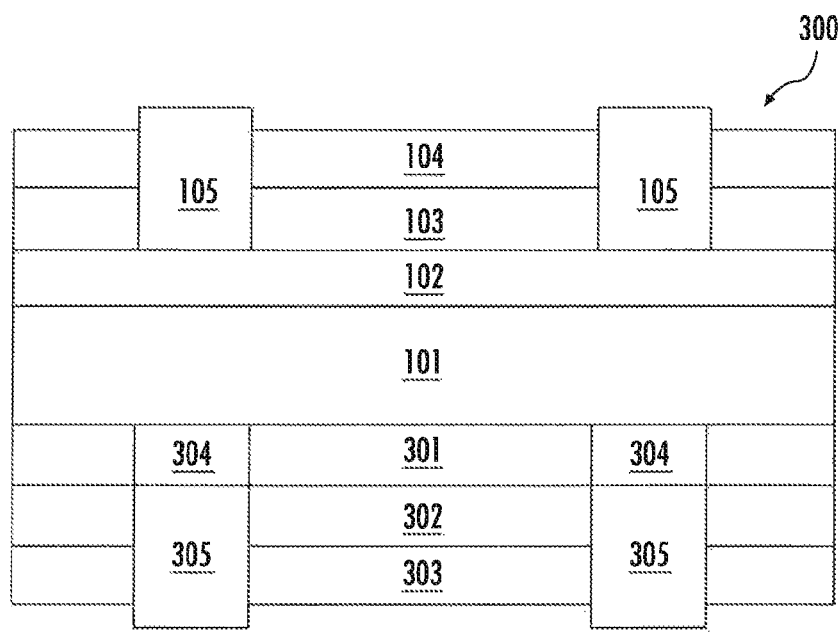
FIG. 3 is a cross-sectional side view of a first embodiment of the bifacial solar cell.

FIG. 3 is a cross-sectional side view of a first embodiment of a bifacial solar cell. The solar cell 300 is a bifacial solar cell with a rear selective emitter 304 and aluminum contacts 305. This solar cell 300 includes an n-type substrate 101, an n-type FSF 102, a $SiO_2$ layer 103, and a $SiN_x$ layer 104. The n-type FSF 102 may be created by doping the substrate with phosphorus. This can be performed using furnace diffusion or ion implantation. On the rear side, the solar cell 300 includes a p-type emitter 301, second $SiO_2$ layer 302, and second $SiN_x$ layer 303. The p-type emitter may be created by doping the substrate with boron, such as by diffusion or ion implantation. Contacts 305 are disposed on a selective emitter 304. This selective emitter 304 may be formed by implanting aluminum ions into the emitter 301 using a mask, such as the mask 201 of FIG. 2. In other embodiments, other selective implantation techniques may be used. For example, an ion beam modified by the plasma sheath may be used to implant only the portion of the substrate that corresponds to the selective emitter 304. In other embodiments, a grid can be used to focus a plasma toward this portion. The aluminum selective emitter 304 may be more heavily doped than the p-type emitter 301. In addition, the species used to dope the selective emitter 304 may be different than the species used to dope the p-type emitter 301. In some embodiments, boron is used for the p-type emitter 301, while aluminum is used for the selective emitter 304. In other embodiments, boron is used for both the emitter 301 and selective emitter 304. In this embodiment, the front side contacts 105 are affixed directly to the n-type FSF 102.

While the solar cell is bifacial, in many embodiments, there is a primary, or front, side which receives the majority of the incident light and a secondary, or back, side which receives less incident light. In some embodiments, the back side receives mostly reflected light, while the front side receives direct light. As a result, typically the front side contacts 105 will have a more conductive metal, such as silver, to minimize the shading losses for the solar cell due to reflection from the front grid. In some embodiments, the back side metal contacts 305 may use a less conductive material, such as aluminum, which results in more shading losses for light coming in from the back of the solar cell. In addition, the back side may use more metal, such as more and wider grid lines, to reduce series resistance. For example, the contacts 105 may be silver, while the contacts 305 may be aluminum. In other embodiments, contacts 305 may also be silver.

Other manufacturing differences may exist as well between the front side and the back side. For example, the dielectric thickness of the front side is optimized to reduce reflection in the green part of the spectrum. In contrast, the dielectric on the back side is optimized to maximize reflection in the infrared part of the spectrum. In addition, the quality of the dielectric-silicon interface must be much higher on the front side than the back side. So there is a wider choice of dielectric passivation on the back. For instance an oxide should be used for phosphorus on the front side, as shown in FIGS. 3-6, but on the back it may be advantageous to use silicon nitride or titanium dioxide (for cost and optical reasons). Additionally, the front side is preferably textured to minimize reflection. In contrast, the back side may be shiny etched to reduce recombination, reduce the dose requirement, and provide better light scattering. Finally, the dose on the back side can be higher than the equivalent dose on the front side.

Typically, bifacial cells are optimized to minimize reflectance from both sides. The description included above is focused on backside dielectric passivation for cells where the primary purpose of the backside dielectric is to reflect the infrared light that passed through the cells and would be lost through the back.

Bifacial cells can also be designed to perform with same efficiency no matter where the light source resides (front side or backside) of the cells. In this case, the same design rules apply to the metal grids and antireflective coatings on both sides of a true bifacial module.

Figure 4:
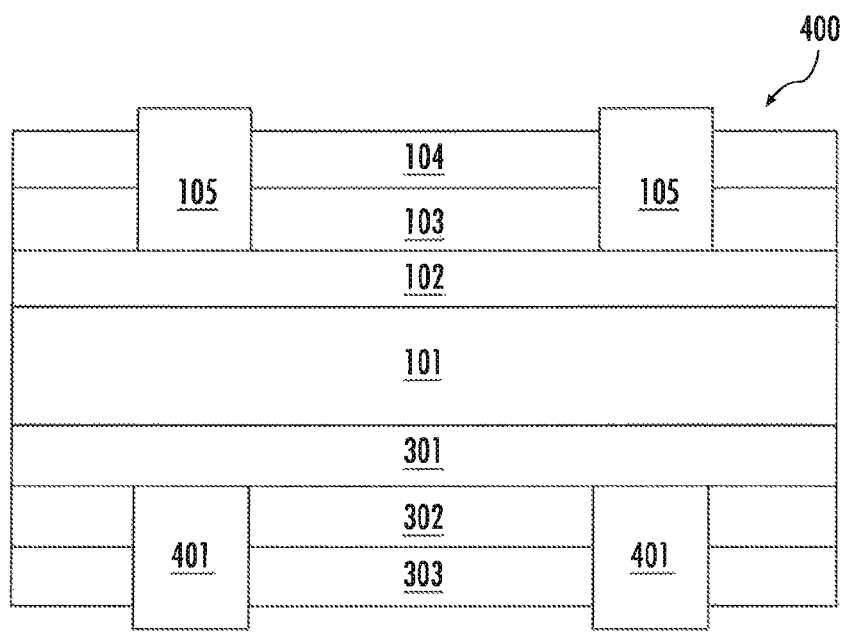
FIG. 4 is a cross-sectional side view of a second embodiment of a solar cell.

FIG. 4 is a cross-sectional side view of a second embodiment of a solar cell. The solar cell 400 is a bifacial cell with rear contacts 401. This solar cell 400 includes an n-type substrate 101, an n-type FSF 102, a SiO$_2$ layer 103, and a SiN$_x$ layer 104. The n-type FSF 102 may be created by doping the substrate with phosphorus. This can be performed using furnace diffusion or ion implantation. On the rear side, the solar cell 400 includes a p-type emitter 301, second SiO$_2$ layer 302, and second SiN$_x$ layer 303. The p-type emitter may be created by doping the substrate with boron, such as by diffusion or ion implantation. Silver or aluminum contacts 401 are disposed on the p-type emitter 301.

Figure 5:
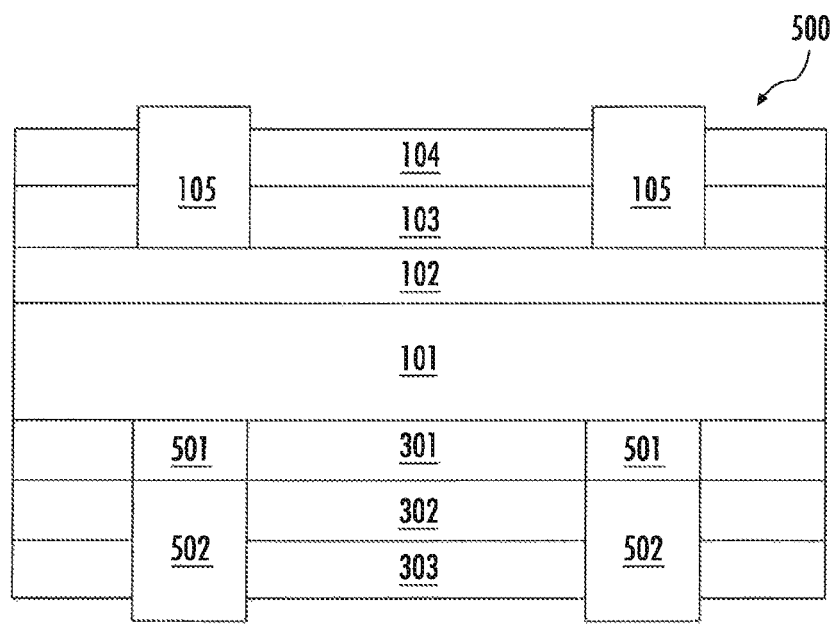
FIG. 5 is a cross-sectional side view of a third embodiment of a solar cell.

FIG. 5 is a cross-sectional side view of a third embodiment of a solar cell. The solar cell 500 is a bifacial cell with a rear selective emitter 501. This solar cell 500 includes a p-type selective emitter 501 within the p-type emitter 301. In this embodiment, boron is used for both the emitter 301 and selective emitter 501. Thus, the p-type selective emitter 501 has a higher dose of boron than the p-type emitter 301. The selective emitter 501 may be created using a mask, such as the mask 201 of FIG. 2. In other embodiments, other selective implantation techniques may be used. For example, an ion beam modified by the plasma sheath may be used to implant only the portion of the substrate that corresponds to the p-type selective emitter 501. In other embodiments, a grid can be used to focus a plasma toward this portion. Contacts 502, which may be silver or aluminum, are disposed on the rear of the solar cell 500. Thus, solar cell 500 differs from solar cell 300, of FIG. 3, in that the selective emitter 501 is boron, while the selective emitter 304 of FIG. 3 is aluminum.

Figure 6:
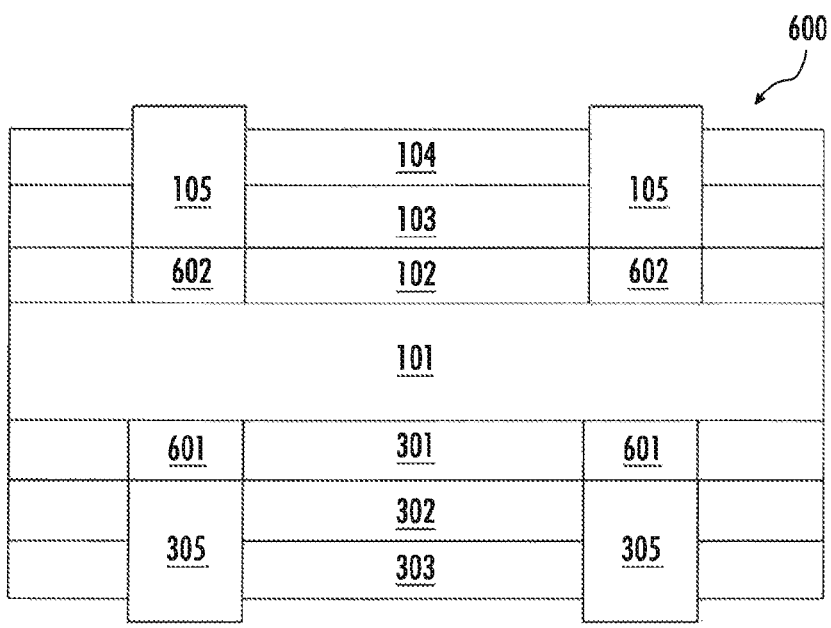
FIG. 6 is a cross-sectional side view of a fourth embodiment of a solar cell.

FIG. 6 is a cross-sectional side view of a fourth embodiment of a solar cell. The solar cell 600 is a bifacial cell with a p-type rear selective emitter 601 and n+-type front selective FSF regions 602. The p-type rear selective emitter 601 may be created by implanting a Group III species, such as boron or aluminum, using a mask, such as the mask 201 of FIG. 2. In other embodiments, other selective implantation techniques may be used. For example, an ion beam modified by the plasma sheath may be used to implant only the portion of the substrate that corresponds to the p-type rear selective emitter 601. In other embodiments, a grid can be used to focus a plasma toward this portion. This solar cell 600 has contacts 305 disposed on the p-type selective emitter 601. These contacts 305 are preferably aluminum, but may be silver if desired. The n-type FSF 102 may be created by doping the substrate with phosphorus. This can be performed using furnace diffusion or ion implantation. The n+-type front selective FSF regions 602 are made by implanting a Group V species of ions, such as phosphorus, using a mask, such as the mask 201 of FIG. 2. Other selective implantation techniques may also be used. The contacts 105 are disposed on the n+-type front selective FSF regions 602, located within the n-type FSF 102. These contacts 105 are preferably silver.

Figure 9:
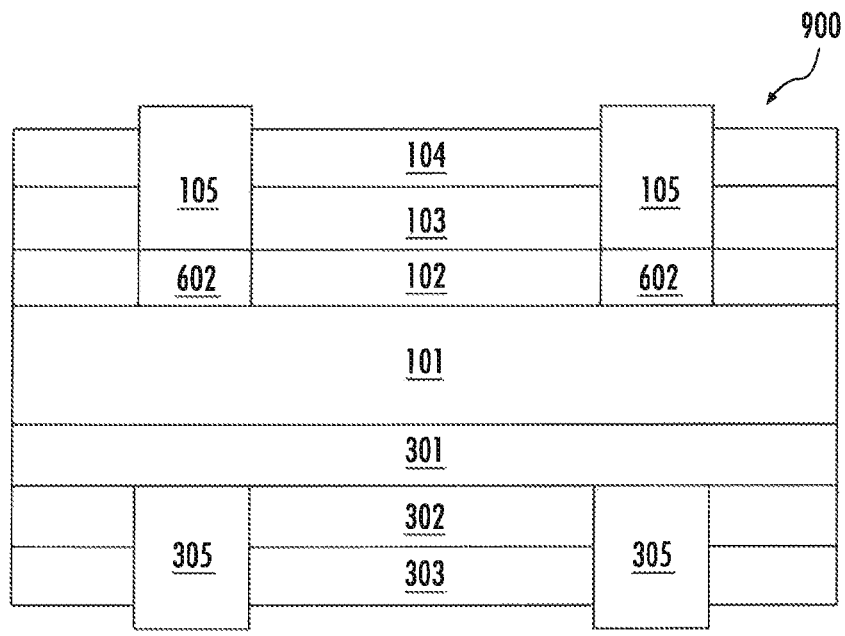
FIG. 9 is a cross-sectional side view of a seventh embodiment of a solar cell.

FIG. 9 is a cross-sectional side view of a fifth embodiment of a solar cell. The solar cell 900 is a bifacial cell with a p-type emitter 301 and n+-type front selective FSF regions 602. This solar cell 900 has contacts 305 disposed on the p-type emitter 301. These contacts 305 are preferably aluminum, but may be silver if desired. The n-type FSF 102 may be created by doping the substrate with phosphorus. This can be performed using furnace diffusion or ion implantation. The n+-type front selective FSF regions 602 are made by implanting a Group V species of ions, such as phosphorus, using a mask, such as the mask 201 of FIG. 2. In other embodiments, other selective implantation techniques may be used. For example, an ion beam modified by the plasma sheath may be used to implant only the portion of the substrate that corresponds to the n+-type front selective FSF regions 602. In other embodiments, a grid can be used to focus a plasma toward this portion. The contacts 105 are disposed on the n+-type front selective FSF regions 602, located within the n-type FSF 102. These contacts 105 are preferably silver.

In some embodiments, the emitter is located on the front side of the bifacial solar cell. The remaining embodiments all include a front-side emitter 701 with a back side field 703.

Figure 7:
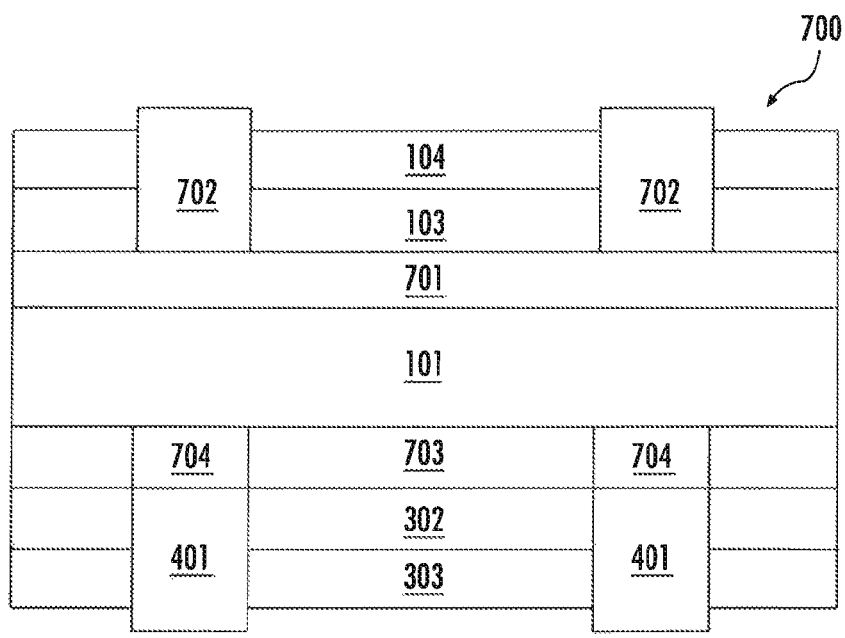
FIG. 7 is a cross-sectional side view of a fifth embodiment of a solar cell.

FIG. 7 is a cross-sectional side view of a sixth embodiment of a solar cell. Solar cell 700 is bifacial cell with the p-type emitter located on the front side, with a BSF using a rear selective BSF. This solar cell 700 has front contacts 702 disposed on the p-type emitter 701. The front contacts 702 may be aluminum or silver. The p-type emitter 701 may be doped with a Group III species, such as boron. On the back side, a BSF 703 is created by doping the n-type substrate 101 with a Group V species, such as phosphorus. Selective BSF regions 704 may also be phosphorus, or another Group V species, and may be more heavily doped than the BSF 703. These may be created using a mask, such as the mask 201 of FIG. 2. In other embodiments, other selective implantation techniques may be used. For example, an ion beam modified by the plasma sheath may be used to implant only the portion of the substrate that corresponds to the selective BSF regions 704. In other embodiments, a grid can be used to focus a plasma toward this portion. The contacts 401 are disposed on the selective BSF regions 704. The contacts 401 may be silver. In other embodiments, the contacts 401 may be aluminum.

Figure 8:
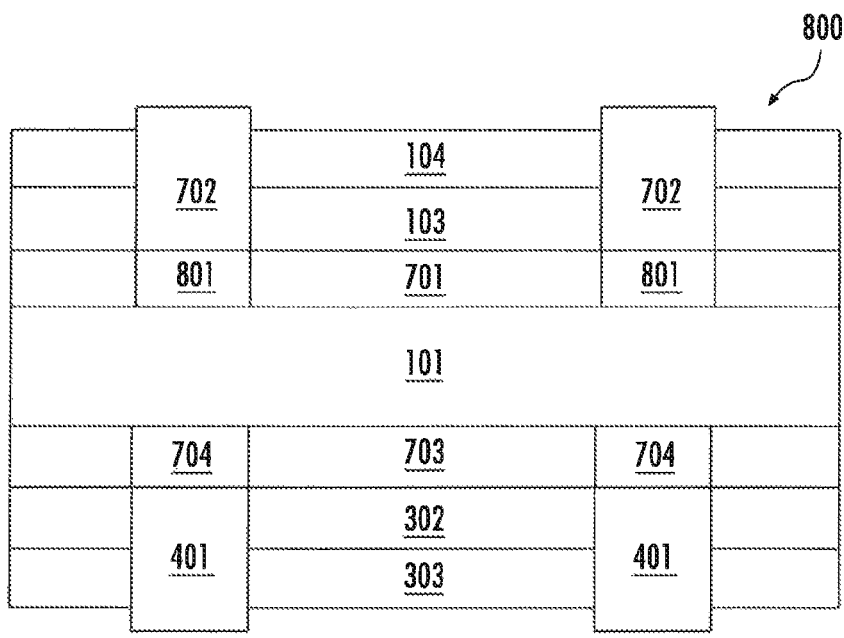
FIG. 8 is a cross-sectional side view of a sixth embodiment of a solar cell.

FIG. 8 is a cross-sectional side view of a seventh embodiment of a solar cell. Solar cell 800 is bifacial cell with the p-type emitter and a selective emitter located on the front side, with a BSF using a rear selective BSF. This solar cell 800 has a p-type selective emitter 801 on the front side, located in the p-type emitter 701. The p-type selective emitter 801 may be created by implanting a Group III species, such as boron or aluminum, using a mask, such as the mask 201 of FIG. 2. In other embodiments, other selective implantation techniques may be used. For example, an ion beam modified by the plasma sheath may be used to implant only the portion of the substrate that corresponds to the p-type selective emitter 801. In other embodiments, a grid can be used to focus a plasma toward this portion. The front contacts 702 are disposed on the p-type selective emitter 801. The front contacts 702 may be aluminum or silver. The p-type emitter 701 may be doped with a Group III species, such as boron. On the back side, a BSF 703 is created by doping the n-type substrate 101 with a Group V species, such as phosphorus. Selective BSF regions 704 are created using a mask, wherein the implanted ions may also be phosphorus, or another Group V species. Selective high-dopant BSF regions 704 are more heavily doped than the BSF 703. The contacts 401 are disposed on the selective BSF regions 704. The contacts 401 may be silver. In other embodiments, the contacts 401 may be silver.

Figure 10:
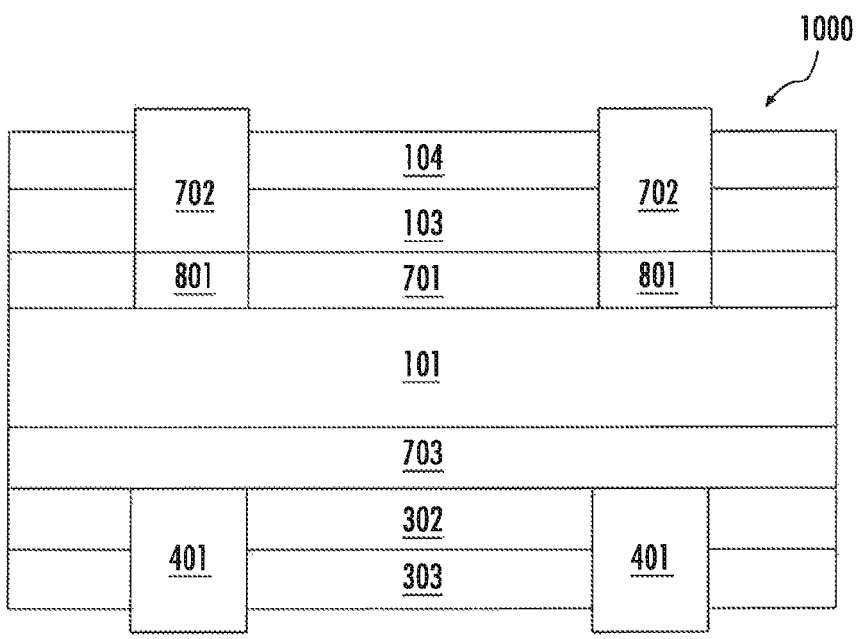
FIG. 10 is a cross-sectional side view of an eighth embodiment of a solar cell.

FIG. 10 is a cross-sectional side view of an eighth embodiment of a solar cell. Solar cell 1000 is bifacial cell with the p-type emitter and a selective emitter located on the front side, with a BSF. This solar cell 1000 has a p-type selective emitter 801 on the front side, located in the p-type emitter 701. The p-type selective emitter 801 may be created by implanting a Group III species, such as boron or aluminum, using a mask, such as the mask 201 of FIG. 2. In other embodiments, other selective implantation techniques may be used. For example, an ion beam modified by the plasma sheath may be used to implant only the portion of the substrate that corresponds to the p-type selective emitter 801. In other embodiments, a grid can be used to focus a plasma toward this portion. The front contacts 702 are disposed on the p-type selective emitter 801. The front contacts 702 may be aluminum or silver. The p-type emitter 701 may be doped with a Group III species, such as boron. On the back side, a BSF 703 is created by doping the n-type substrate 101 with a Group V species, such as phosphorus. The contacts 401 are disposed on the BSF 703. The contacts 401 may be silver. In other embodiments, the contacts 401 may be silver.

In the embodiments described herein, the oxide or nitride layers may be deposited or grown in a furnace. Contacts may be fabricated using screen printing or other metallization techniques, such as plating. Other fabrication methods known to those skilled in the art also may be performed.

Any p-type or n-type layers in the solar cell embodiments described herein may be formed using ion implantation. This ion implantation may be selective or blanket depending on the particular design of the p-type or n-type layer. For example, selective emitters and selective FSF and BSF regions may be created using a selective ion implantation. Emitters, FSF and BSF regions may be created using blanket implants.

The embodiments shown in FIGS. 3-6 and 9 use an n-type substrate 101 with a rear emitter 301. This enables higher back surface reflection (BSR) and back surface recombination velocity (BSRV). Such designs also use the full solar cell surface for a p-n junction and may not require full passivation of a p-type emitter.

Other similar designs may be fabricated using a p-type substrate instead of an n-type substrate 101. This may reverse the n-type and p-type doping of the solar cells.

Other designs, such as those shown in FIGS. 7-8 and 10, may have a front emitter 701.

In one instance, the n-type substrate 101 is doped silicon having a resistivity greater than 10 Ωcm and having a minority carrier lifetime (bulk $\tau_p$) greater than 1.5 ms.

The FSF implant 102, in FIGS. 3-6 and 9, may be a blanket implant producing a sheet resistance of 50 Ω/sq, performed using any Group V species. The selective FSF implant 602 of FIG. 6 may be a selective implant producing a sheet resistance of 50-150 Ω/sq. The selective implant implants a Group V species through a mask, such as that shown in FIG. 2.

The p-type implant for the rear emitter in FIGS. 3-6 and 9 may vary in dosage, with dopant doses of 1e14 to 1e16 at implant energies between 1 and 40 keV being used in some embodiments.

In some embodiments, an anneal may occur at 925° C. with 5 minute oxidation and 25 minute $N_2$ or Ar anneal. This anneal is used to create the passivation and anti-reflective layers. In other embodiments, the anneal temperature can vary from 800° to 1100° C., with a duration from 1 min to 3-4 hours. In some embodiment, a thermal oxide is grown during this anneal. However, in other embodiments, a thermal oxide is not grown at his time. The ambient atmosphere may be nitrogen, oxygen, helium, neon, argon, or a mixture of these gasses. In other embodiments, other gas mixtures, such as HCl or DCE, mixed with oxygen, may be used.

Screen printing of contacts may use both a print and dry step on both the front and rear surfaces. Solar cells may be co-fired in one particular instance. In some embodiments, alternate metallization techniques (such as plating for example) may be used rather than screen printing. Metals that can be plated include nickel for a seed layer and copper or silver for the contacts.

The implants and anneal operations may be done in a variety of sequences. For example, in one embodiment, the process sequence includes implanting a first species, performing an anneal, implanting a second species, and performing a second anneal, where the anneals are optimized to deliver the desired profiles for each of the implanted species. Alternatively, the sequence may include completing the implants on both sides and have a common anneal for both the sides. The advantage of a single anneal is simpler (cost effective) process but a drawback may be non-optimal profile for both species due to difference in diffusivities/solubilities of the two dopant species. In addition, a common passivating layer is less likely to be obtained with a single anneal operation.

In another embodiment, the implant, anneal and passivation of one species may be completed before the process for the other species is begun.

In addition, the surface of the solar cell may be cleaned between different annealing steps.

While planar surfaces are illustrated in FIGS. 1-10, embodiments of the solar cells described herein may have textured surfaces. This may be formed using a chemical or plasma etch, for instance.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of producing a bifacial solar cell using an n-type substrate comprising:
    implanting a first species of n-type dopant in a back side of said n-type substrate to create an emitter, wherein said first species of n-type dopant comprises a Group V element;
    implanting a first species of p-type dopant in a front side of said n-type substrate to create a surface field, wherein said first species of p-type dopant comprises a Group III element;
    selectively implanting an additional p-type dopant to create doped contact regions on said front side of said n-type substrate, wherein said additional dopant comprises a Group III element;
    treating said n-type substrate thermally; and
    using a metallization technique to add metal contacts to the front side of said n-type substrate, wherein less than an entirety of said front side is covered with said metal contacts and said metal contacts are disposed on said doped contact regions.

2. The method of claim 1, wherein said first species of p-type dopant comprises one of boron or aluminum, said first species of n-type dopant comprises one of phosphorus or arsenic, and said additional p-type dopant comprises one of boron or aluminum.

3. The method of claim 1, further comprising:
    selectively implanting an additional n-type dopant to create doped contact regions on said back side of said n-type substrate, wherein said additional p-type dopant comprises a Group V element.

4. The method claim 3, wherein said first species of p-type dopant comprises one of boron or aluminum, said first species of n-type dopant comprises one of phosphorus or arsenic, additional p-type dopant comprises one of boron or aluminum, and said additional n-type dopant comprises one of phosphorous or arsenic.

5. The method of claim 1, wherein said metal contacts on said front side comprise a metal that is predominantly comprised of silver.

6. The method of claim 1, wherein said metal contacts on said front side comprise a metal that is predominantly comprised of one of aluminum or copper.

7. A method of producing a bifacial solar cell using an n-type substrate comprising:
    implanting a first species of n-type dopant in a back side of said n-type substrate to create an emitter, wherein said first species of n-type dopant comprises a Group V element;
    implanting a first species of p-type dopant in a front side of said n-type substrate to create a surface field, wherein said first species of p-type dopant comprises a Group III element;
    selectively implanting an additional p-type dopant to create doped contact regions on said front side of said n-type substrate, wherein said additional dopant comprises a Group III element;
    treating said n-type substrate thermally; and
    using a metallization technique to add metal contacts to the back side of said n-type substrate, wherein less than an entirety of said front side is covered with said metal contacts and said metal contacts are disposed on said doped contact regions.

8. The method of claim 7, wherein said first species of p-type dopant comprises one of boron or aluminum, said first species of n-type dopant comprises one of phosphorus or arsenic, and said additional p-type dopant comprises one of boron or aluminum.

9. The method of claim 7, further comprising:
    selectively implanting an additional n-type dopant to create doped contact regions on said back side of said n-type substrate, wherein said additional p-type dopant comprises a Group V element.

10. The method claim 9, wherein said first species of p-type dopant comprises one of boron or aluminum, said first species of n-type dopant comprises one of phosphorus or arsenic, said additional p-type dopant comprises one of boron or aluminum, and said additional n-type dopant comprises one of phosphorous or arsenic.

11. The method of claim 7, wherein said metal contacts on said back side comprise a metal that is predominantly comprised of silver.

12. The method of claim 7, wherein said metal contacts on said front side comprise a metal that is predominantly comprised of one of aluminum or copper.

* * * * *